US007224060B2

(12) United States Patent
Zhang et al.

(10) Patent No.: US 7,224,060 B2
(45) Date of Patent: May 29, 2007

(54) INTEGRATED CIRCUIT WITH PROTECTIVE MOAT

(75) Inventors: Fan Zhang, Singapore (SG); Kho Liep Chok, Singapore (SG); Tae Jong Lee, Singapore (SG); Xiaomei Bu, Singapore (SG); Meng Luo, Singapore (SG); Chian Yuh Sin, Singapore (SG); Yee Mei Foong, Singapore (SG); Luona Goh, Singapore (SG); Liang Choo Hsia, Singapore (SG); Huey Ming Chong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 228 days.

(21) Appl. No.: 10/768,796

(22) Filed: Jan. 30, 2004

(65) Prior Publication Data

US 2005/0167824 A1    Aug. 4, 2005

(51) Int. Cl.
  *H01L 23/04* (2006.01)
(52) U.S. Cl. .............. 257/730; 257/773; 257/758; 257/784; 257/786; 257/700; 257/774; 257/734; 257/748; 257/750; 438/424; 438/462
(58) Field of Classification Search .......... 257/620, 257/786, 773, 758, 759, 691, 692, 698, 774, 257/730, 700, 127, 621, 622, 734, 748, 75; 438/113, 456, 462, 637, 700, 701, 713, 622, 438/623, 424
See application file for complete search history.

(56) References Cited

U.S. PATENT DOCUMENTS

| | | | |
|---|---|---|---|
| 5,689,134 A * | 11/1997 | Pasch et al. ............... 257/659 |
| 6,518,673 B2 * | 2/2003 | Herr et al. ............... 257/758 |
| 2002/0145196 A1 | 10/2002 | Wang | |
| 2002/0167071 A1 | 11/2002 | Wang | |
| 2003/0073257 A1 * | 4/2003 | Watanabe ............... 438/14 |
| 2003/0134457 A1 * | 7/2003 | Kim et al. ............... 438/132 |
| 2003/0160261 A1 | 8/2003 | Moriya | |
| 2004/0084775 A1 * | 5/2004 | Sugino et al. ............ 257/758 |
| 2004/0124546 A1 * | 7/2004 | Saran et al. ............. 257/787 |

* cited by examiner

*Primary Examiner*—Sara Crane
*Assistant Examiner*—Jungwa Im
(74) *Attorney, Agent, or Firm*—Mikio Ishimaru

(57) ABSTRACT

A method of manufacturing an integrated circuit provides a substrate having a semiconductor device, and includes forming an intermetal dielectric layer over the substrate and the semiconductor device. A metal wire is formed above the semiconductor device and in contact therewith and a passivation layer is formed over the intermetal dielectric layer. A bond pad is formed connected to the metal wire. A protective moat, with sidewall passivation layer, is formed through the passivation layer and the intermetal dielectric layer, and is located between the metal wire and an outside edge of the integrated circuit.

24 Claims, 5 Drawing Sheets

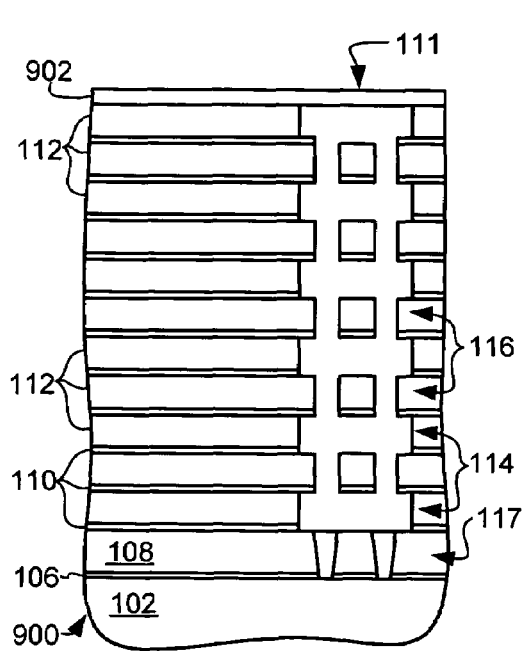
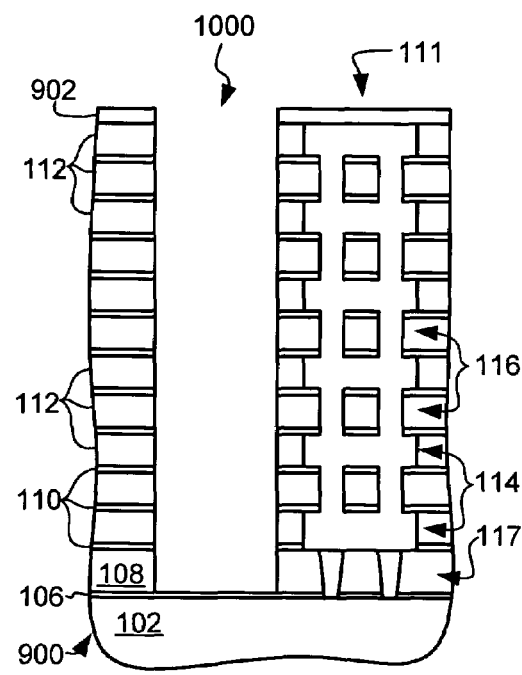
FIG. 9
FIG. 10
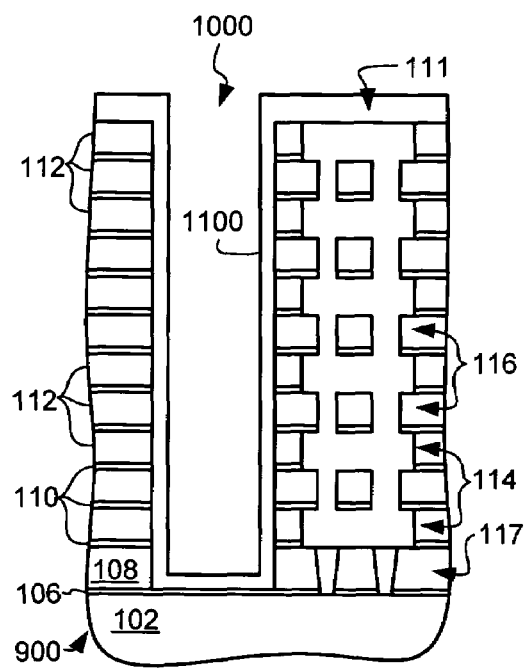
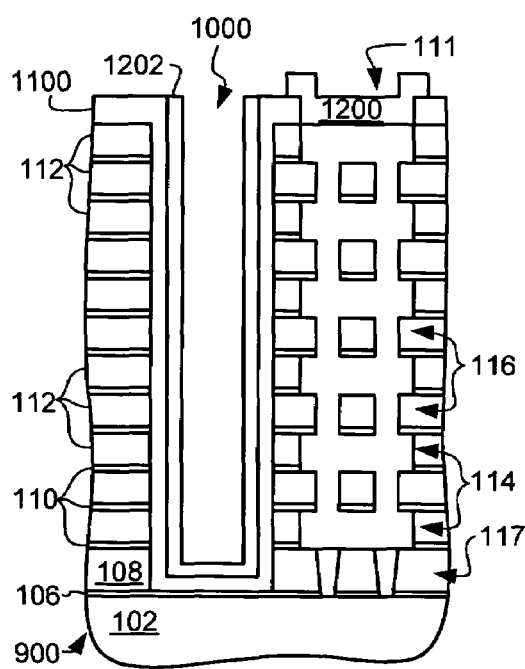
FIG. 11
FIG. 12

INTEGRATED CIRCUIT WITH PROTECTIVE MOAT

TECHNICAL FIELD

The present invention relates generally to integrated circuits, and more specifically to protective structures around integrated circuits.

BACKGROUND ART

Integrated circuit technology has been progressing rapidly to the point where integrated circuits incorporating millions of transistors are possible in such products as cell phones, televisions, and personal computers.

However, as more and more complex products are developed, even more rapid development of new technologies is required to reduce the size of individual transistors, memory units, and their connections, and to change the materials used in the manufacture of integrated circuits. For example, newer technologies have included decreasing the spacings of conductive lines below 0.13 um and changing the materials being used from conventional aluminum conductor with silicon dioxide dielectric layers ($Al/SiO_2$) combinations to copper conductor with low or ultra-low dielectric constant material (Cu/low or ultra-low k) systems.

With the introduction of Cu/low or ultra-low k systems, reliability issues never seen before have occurred. For example, moisture attacks have occurred during package-level autoclaving, pressure cooker testing (PCT), thermal humidity bias (THB) testing, and highly accelerated stress test (HAST) testing.

It was found that micro-cracks were induced in the periphery of the integrated circuits during the wafer dicing process and that moisture could penetrate through the micro-cracks along the conductor and low k dielectric interface. This moisture penetration eventually leads to failures of the integrated circuits.

The moisture failure problems become more prominent when ultra-low k dielectric materials are used because such materials have extremely porous structures which are more vulnerable to moisture attack.

Other problems, which occur with the use of new materials and the move toward smaller integrated circuit line spacings, include delamination between the top dielectric layer containing the metal wires (intermetal dielectric layers (IMD)) and the capping layer, and copper out-diffusion after the delamination occurs.

Solutions to these problems have been long sought, but prior developments have not taught or suggested any solutions and, thus, solutions to these problems have long eluded those skilled in the art.

DISCLOSURE OF THE INVENTION

The present invention provides a method of manufacturing an integrated circuit provides a substrate having a semiconductor device, and includes forming an intermetal dielectric layer over the substrate and the semiconductor device. A metal wire is formed above the semiconductor device and in contact therewith and a passivation layer is formed over the intermetal dielectric layer. A bond pad is formed connected to the metal wire. A protective moat is formed through the passivation layer and the intermetal dielectric layer, and is located between the metal wire and an outside edge of the integrated circuit.

The present invention provides an integrated circuit provides a substrate having a semiconductor device, and includes an intermetal dielectric layer over the substrate and the semiconductor device. A metal wire is above the semiconductor device and in contact therewith and a passivation layer is over the intermetal dielectric layer. A bond pad is connected to the metal wire. A protective moat is through the passivation layer and the intermetal dielectric layer, and is located between the metal wire and an outside edge of the integrated circuit.

Failures have been essentially eliminated during package-level autoclaving, pressure cooker testing (PCT), thermal humidity bias (THB) testing, and highly accelerated stress test (HAST) testing.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 9 is a partial cross-sectional view of an integrated circuit in an intermediate stage of manufacture after depositing a passivation layer thereon;

FIG. 10 is the structure of FIG. 9 after forming a protective moat therein;

FIG. 11 is the structure of FIG. 10 after depositing an additional passivation layer over the passivation layer and into the protective moat;

FIG. 12 is the structure of FIG. 11 after patterning and etching the additional passivation layer and forming a bond pad therein.

BEST MODE FOR CARRYING OUT THE INVENTION

Figures 1, 2:
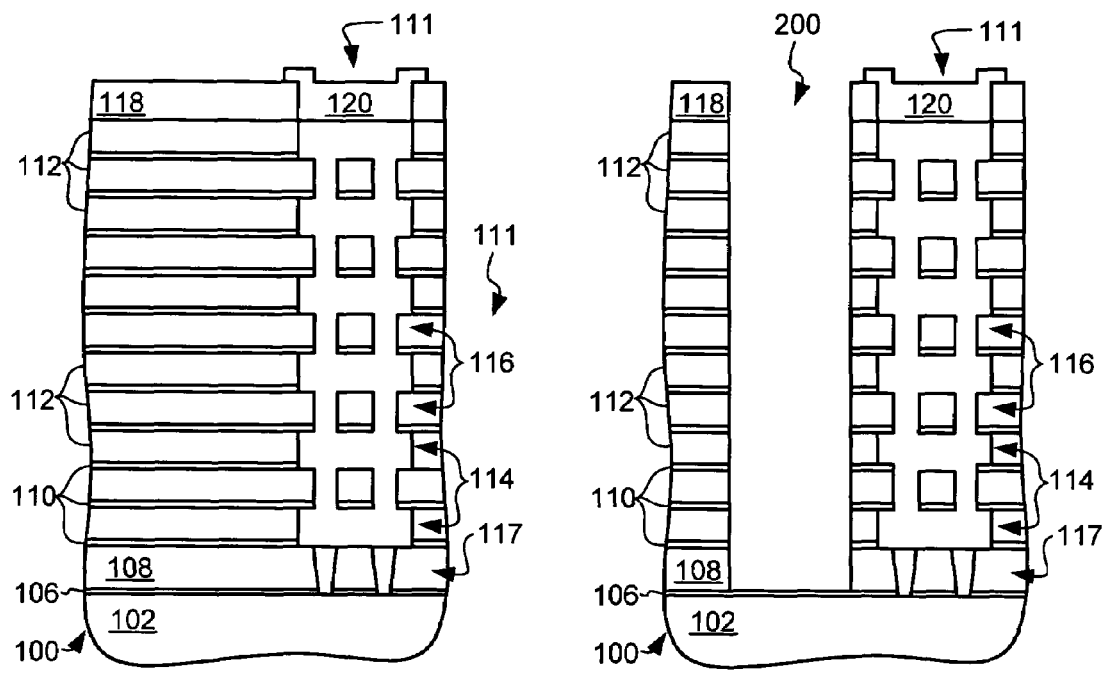
FIG. 1 is a partial cross-sectional view of an integrated circuit in an intermediate stage of manufacture after depositing a passivation layer and forming a bond pad therein.
FIG. 2 is the structure of FIG. 1 after forming a protective moat therein in accordance with an embodiment of the present invention.

In the following description, numerous specific details are given to provide a thorough understanding of the invention. However, it will become apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing figures. The same numbers will be used in all the drawing figures to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side", "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure. The term "forming" as used herein includes processes such as depositing, growing, building, chemically combining, or other processes, which are known for forming layers, films, and structures.

Referring now to FIG. 1, therein is shown an integrated circuit 100 in an intermediate stage of manufacture.

The integrated circuit 100 includes a substrate 102, generally of silicon (Si), having a semiconductor device 300 (shown in FIG. 3) in and above the substrate 102. A liner layer 106, generally an nitride (SiN) or oxide (SiO$_2$), is disposed above the substrate 102 and has a contact dielectric layer 108, generally a film stack of oxide and nitride, deposited thereon. The contact dielectric layer 108 is so-called because it contains contacts to semiconductor devices 300 (shown in FIG. 3) in the substrate 102.

Above the contact dielectric layer 108 are a number of etch stop layers 110 interspaced with intermetal dielectric (IMD) layers 112. For clarity, only a limited number of these layers are designated in the FIGs, but the locations are typical. The etch stop layers 110 are generally of nitride, carbide or other dielectric materials having dielectric constants generally above 3.9. The IMD layers 112 are of low k dielectric materials with dielectric constants from 3.9 down to about 2.5 or ultra-low k dielectric materials with dielectric constants below about 2.5. Examples of low k dielectric materials are polyimide (PI) and benzocyclobutene (BCB). Examples of ultra-low k dielectric materials are polyimide nanofoams and silica aerogels.

A guard ring 111 is optionally formed by forming metal wires 114 in alternate layers of the IMD layers 112 are, which are conductively connected by vias 116 in alternate layers of the IMD layers 112 and in various of the etch stop layers 110. The guard ring 111 includes trench contacts 117 to the substrate 102. The metal wires 114, the vias 116, and the trench contacts 117 can be of various conductive metals such as copper (Cu), aluminum (Al), gold (Au), silver (Ag), etc. In the embodiment shown, the conductive metal is copper. The guard ring 111 is formed around the metal wires and vias typified by connections 302 connected to the semiconductor devices 300 of FIG. 3.

The topmost layer of the IMD layers 112 is capped by a passivation layer 118, generally a film stack of oxide and nitride. The topmost metal wires 114 may optionally have a cap ring 120 attached thereto, generally one of the conductive metals and aluminum in the embodiment shown, exposed through the passivation layer 118.

Referring now to FIG. 2, therein is shown the structure of FIG. 1 having a protective moat 200 formed therein. The protective moat 200 extends through the passivation layer 118, down through the various IMD layers 112 and etch stop layers 110, down to the contact dielectric layer 108. The protective moat 200 may be formed in a number of different manners, but etching may generally be used. It has been discovered that the protective moat 200 provides some benefits in just the IMD layers 112 and the most benefits through to the substrate 102 but that the costs of additional steps to extend through the liner layer 106 and the contact dielectric layer 108 should be balanced against the benefits obtained.

Figure 3:
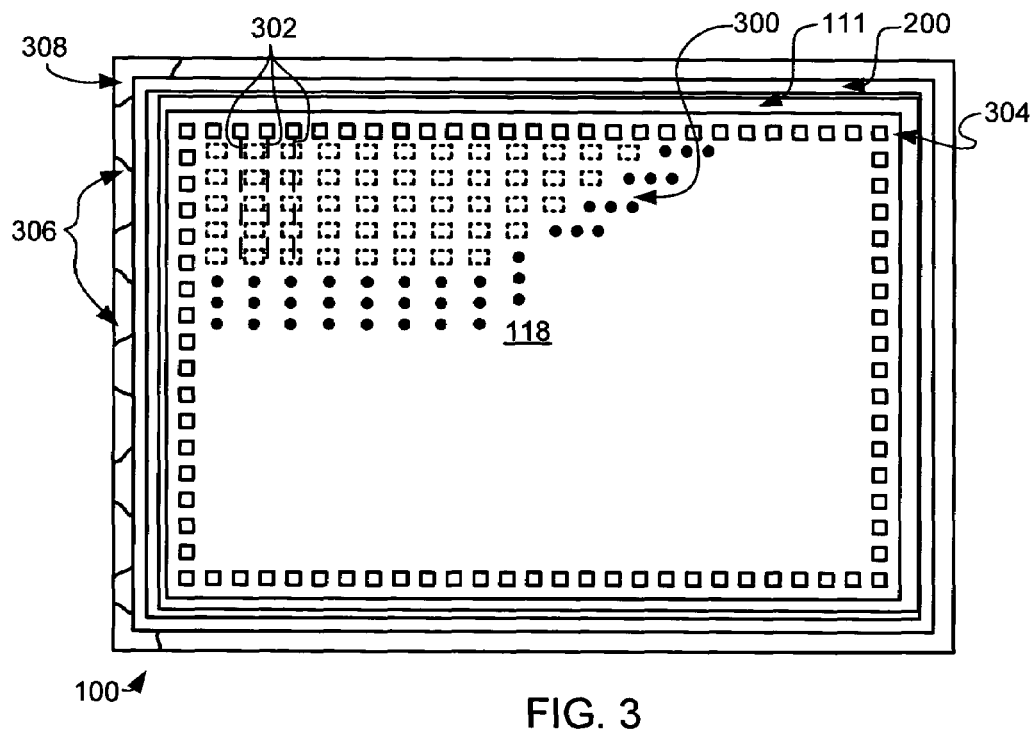
FIG. 3 is a plan view of the integrated circuit incorporating the structure of FIG. 2.

Referring now to FIG. 3, therein is shown a plan view of the integrated circuit 100 showing the passivation layer 118, the guard ring 111, the cap ring 120, the protective moat 200, and a number of bond pads 304 to which the connections 302 are connected. The bond pads 304 are subject to the same processing as the cap ring 120 and are subject to the same processes.

It has been discovered that the protective moat 200 adjacent and surrounding the outer perimeter of the integrated circuit 100 will block cracks 306, which are induced by the singulation process used to saw a semiconductor wafer into the individual integrated circuit 100. At the same time, the protective moat 200 diverts cracks 308 at the corners of the integrated circuit 100 from reaching the IMD layers 112 around the metal wires 114. Further, it has been discovered that the protective moat 200 will also help to minimize cracking during assembly and mechanical tests.

With regard to design of the protective moat 200, it has been discovered that the protective moat 200 works well when it is entirely around the perimeter of the integrated circuit 100 so that all the vertical edges of the low or ultra-low k dielectric material of the IMD layers 112 that may be exposed after wafer sawing are protected. It has also been discovered that the protective moat 200 will provide blocking around the entire integrated circuit 100 regardless of whether it parallels the edges of the saw cuts or if it curves in various locations. At the same time, it has been discovered that the exact cross-sectional shape of the protective moat 200 is not critical as long as the protective moat 200 is deep enough to protect the low and ultra-low k dielectric materials. As a result, without being limiting, the protective moat 200 may stop at the etch stop layer above the contact dielectric layer, on the contact dielectric layer, at the liner layer 106, or on the substrate 102.

Figure 4:
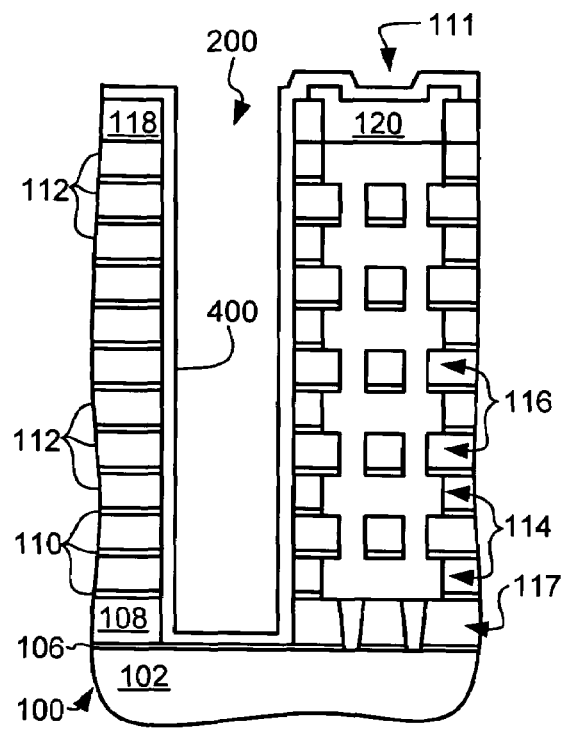
FIG. 4 is the structure of FIG. 2 after depositing an additional passivation layer over the passivation layer and into the protective moat in accordance with another embodiment of the present invention.

Referring now to FIG. 4, therein is shown the structure of FIG. 2 after depositing an additional passivation layer 400, which is optional, over the passivation layer 118 and into the protective moat 200 in accordance with another embodiment of the present invention. The additional passivation layer 400 can be a layer of a material such as nitride or oxide. It has also been found that undoped silicon glass/silicon nitride (USG/SiN) or silicon nitride/undoped silicon glass/silicon nitride (SiN/USG/SiN) multilayers are also suitable.

It has been discovered that providing the additional passivation layer 400 provides a good protective shield for low or ultra-low k dielectric devices exposed to high humidity environments. Quite often, moisture seeps between the top IMD layer 112 and the passivation layer 118 to cause delamination or bubbles into which the conductive material of the metal wires 114 diffuses and causes short circuits. The additional passivation layer 400 needs only to coat the vertical edges of the protective moat 200. In autoclave tests, the failure rate of low k using integrated circuits has been between 10% to 43%. After applying the additional passivation layer 400 into the protective moat 200, the failure rate dropped to 0%.

Figure 5:
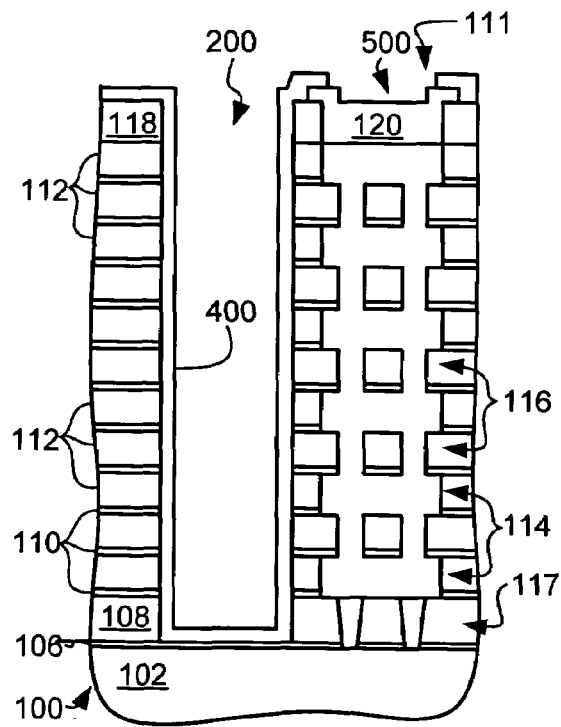
FIG. 5 is the structure of FIG. 4 after patterning and etching the additional passivation layer to partially expose the bond pad in accordance with still another embodiment with the present invention.

Referring now to FIG. 5, therein is shown the structure of FIG. 4 after patterning and etching the additional passivation layer 400 to partially expose the cap ring 120 in a region 500 in accordance with still another embodiment with the present invention.

Figure 6:
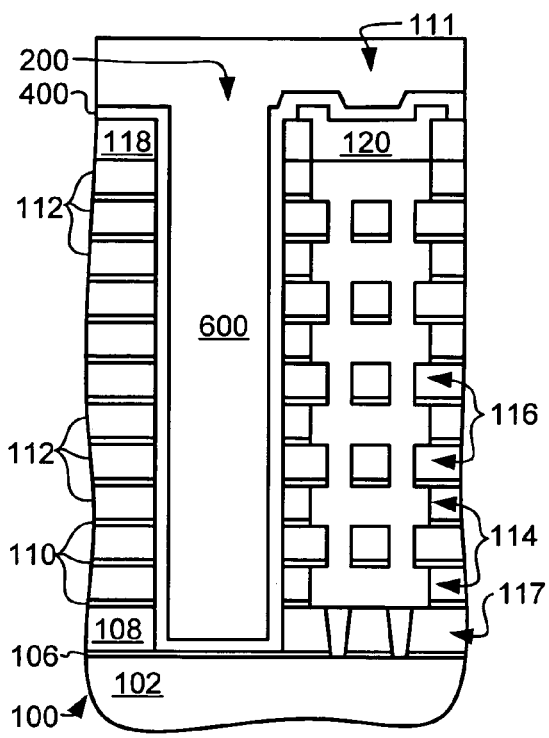
FIG. 6 is the structure of FIG. 4 after depositing a further passivation layer over the additional passivation layer and in the protective moat.

Referring now to FIG. 6, therein is shown the structure of FIG. 4 after depositing a further passivation layer 600, which is optional, over the additional passivation layer 400 and in the protective moat 200. The further passivation layer 600 may be a spin-on material such as a polyimide, benzocyclobutene, or low k dielectric material. The spin-on low k dielectric material of the further passivation layer 600 will completely fill the protective moat 200 and cover the surface of the additional passivation layer 400.

Figure 7:
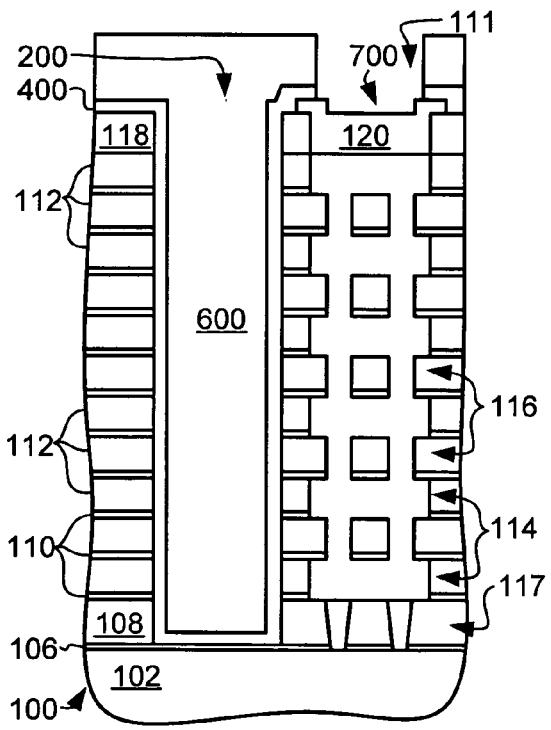
FIG. 7 is the structure of FIG. 6 after patterning and etching the further passivation layer and the additional passivation layer to partially expose the bond pad in accordance with another further embodiment of the present invention.

Referring now to FIG. 7, therein is shown the structure of FIG. 6 after patterning and etching the further passivation layer 600 and the additional passivation layer 400 to partially expose the cap ring 120 in a region 700 in accordance with another further embodiment of the present invention.

Figure 8:
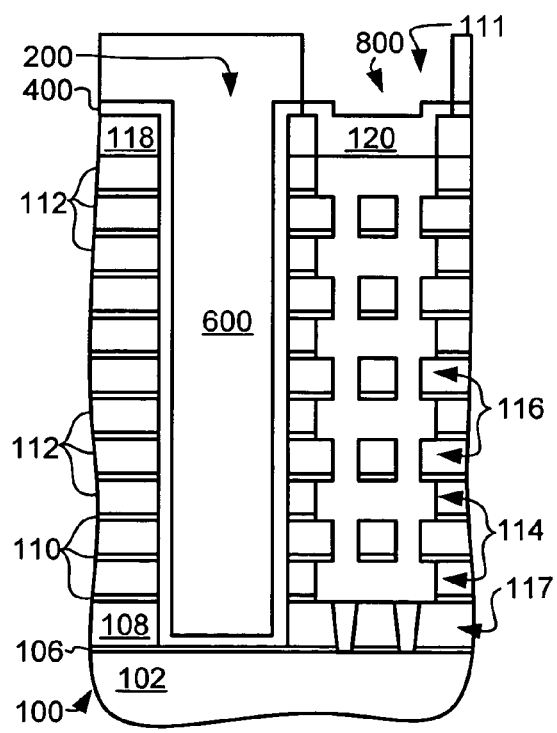
FIG. 8 is the structure of FIG. 6 after patterning and etching the further passivation layer and the additional passivation layer to fully expose the bond pad in accordance with another further embodiment of the present invention.

Referring now to FIG. 8, therein is shown the structure of FIG. 6 after patterning and etching the further passivation layer 600 and the additional passivation layer 400 to fully expose the cap ring 120 in a region 800 in accordance with another further embodiment of the present invention.

Referring now to FIG. 9, therein is shown a partial cross-sectional view of an integrated circuit 900 in an intermediate stage of manufacture after depositing a passivation layer 902, which is optional, thereon. The passivation layer 902 covers the top IMD layer 112, as well as the top metal wire 114.

Referring now to FIG. 10, therein is shown the structure of FIG. 9 after forming a protective moat 1000 therein. The protective moat 1000 extends through the passivation layer 902, down through the various IMD layers 112 and the etch stop layers 110, down to the contact dielectric layer 108. The protective moat 1000 may be formed in a number of different manners, but etching may generally be used.

Referring now to FIG. 11, therein is shown the structure of FIG. 10 after depositing an additional passivation layer 1100, which is optional, over the passivation layer 902 and into the protective moat 1000. The additional passivation layer 1100 in one embodiment is similar to the passivation layer 902 of FIG. 9 and blends therewith to form a single coat in the protective moat 1000.

Referring now to FIG. 12, therein is shown the structure of FIG. 11 after patterning and etching of the additional passivation layer 1100 and forming a cap ring 1200 on the topmost metal wire 114. Also shown in FIG. 12 is an additional metal passivation layer 1202, which is optional, to provide mechanical strength to the structure.

Figure 13:
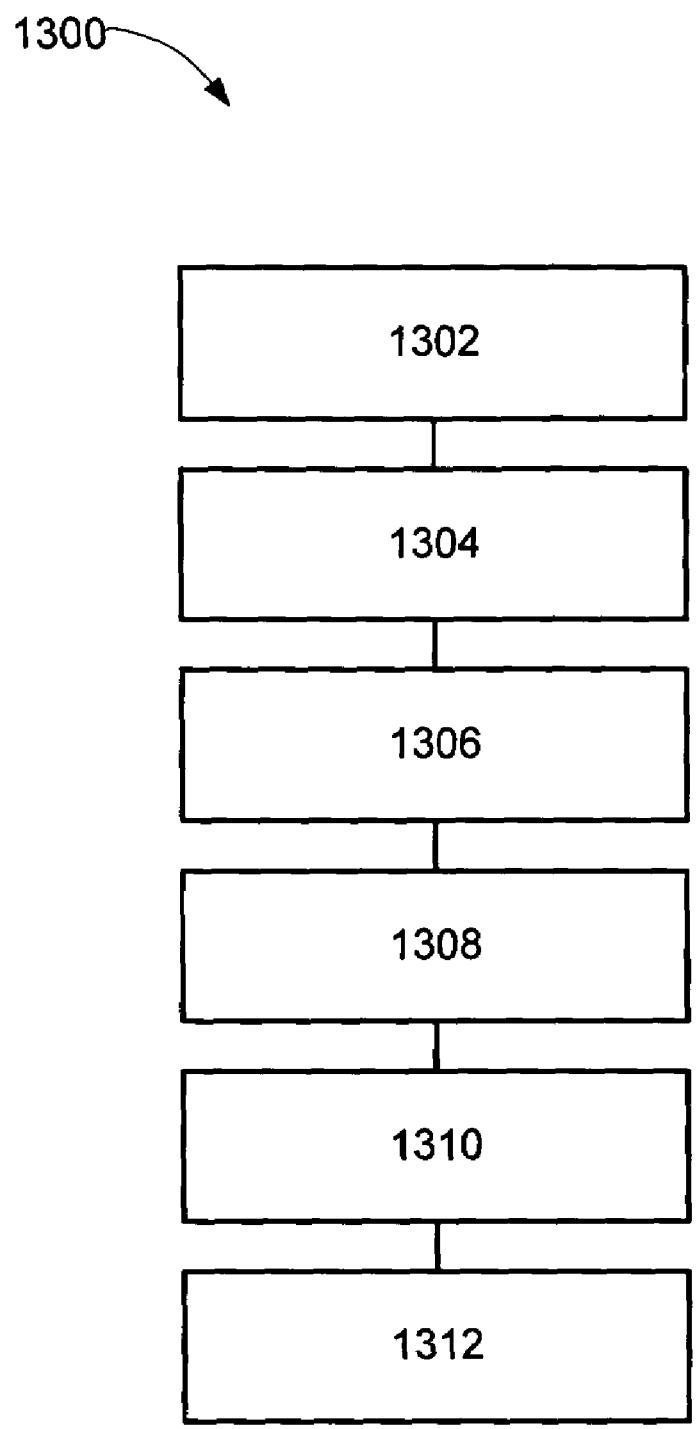
FIG. 13 is a flow chart for the method of manufacturing an integrated circuit in accordance with an embodiment of the present invention.

Referring now to FIG. 13, therein is shown a flow chart for a method 1300 for manufacturing an integrated circuit in accordance with the present invention. The method includes: a block 1302 of providing a substrate having a semiconductor device; a block 1304 of forming a an intermetal dielectric layer over the substrate and the semiconductor device; a block 1306 of forming a metal wire above the semiconductor device and in contact therewith; a block 1308 of forming a passivation layer over the intermetal dielectric layer; a block 1310 of forming a bond pad connected to the metal wire; and a block 1312 of forming forming a protective moat through the passivation layer and the intermetal dielectric layer, the protective moat located between the metal wire and an outside edge of the integrated circuit.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing an integrated circuit comprising:
    providing a substrate having a semiconductor device;
    forming an intermetal dielectric layer over the substrate and the semiconductor device;
    forming a metal wire above the semiconductor device and in contact therewith;
    forming a passivation layer over the intermetal dielectric layer;
    forming a bond pad connected to the metal wire; and
    forming a protective moat through the passivation layer and the intermetal dielectric layer, the protective moat located entirely around the perimeter of the integrated circuit between the metal wire and an outside edge of the integrated circuit.

2. The method as claimed in claim 1 additionally comprising:
    forming a guard ring around the metal wire.

3. The method as claimed in claim 1 additionally comprising:
    forming an additional passivation layer over the passivation layer, the bond pad, and in the protective moat; and
    exposing at least a portion of the bond pad through the additional passivation layer.

4. The method as claimed in claim 1 additionally comprising:
    forming a further passivation layer over the passivation layer, the bond pad, and in the protective moat; and
    exposing at least a portion of the bond pad through the further passivation layer.

5. The method as claimed in claim 1 additionally comprising:
    forming a further passivation layer over the intermetal dielectric layer and in the protective moat; and
    forming the bond pad through the further passivation layer.

6. The method as claimed in claim 1 additionally comprising:
    forming a metal passivation layer in the protective moat.

7. A method of manufacturing an integrated circuit comprising:
    providing a substrate having a semiconductor device;
    forming a contact dielectric layer of a non-low dielectric constant dielectric material over the substrate and the semiconductor device;
    forming a plurality of intermetal dielectric layers over the contact dielectric layer, the plurality of intermetal dielectric layers of at least one of low dielectric constant material, ultra-low dielectric constant material, and a combination of low and ultra-low dielectric constant materials;
    forming a plurality of metal wires above the contact dielectric layer, interconnected by vias, and in contact with the semiconductor device;

forming a passivation layer of at least one of a non-low dielectric constant material, a low dielectric constant material, and a combination of non-low dielectric constant and low dielectric constant materials over the top intermetal dielectric layer;

forming a bond pad connected to at least one of the metal wires; and forming a protective moat entirely around the perimeter of the integrated circuit surrounding a portion of the plurality of intermetal dielectric layers, the plurality of metal wires, and an outside edge of the integrated circuit, forming the protective moat through the passivation layer and the plurality of intermetal dielectric layers and at least one of:

an etch stop layer above the contact dielectric layer, the contact dielectric layer, a liner layer under the contact dielectric layer, and a combination thereof.

8. The method as claimed in claim 7 additionally comprising:

forming a guard ring around the plurality of metal wires including a further plurality of metal wires and vias extending through the plurality of intermetal dielectric layers, the guard ring including trench contacts to the substrate; and forming the protective moat around the at least one guard ring trough the plurality of intermetal dielectric layers.

9. The method as claimed in claim 7 additionally comprising:

forming a further passivation layer of at least one of a non-low dielectric constant material, a low dielectric constant material, and a combination of non-low dielectric constant and low dielectric constant materials over the passivation layer, the bond pad, and in the protective moat; and exposing at least a portion of the bond pad through the further passivation layer.

10. The method as claimed in claim 7 additionally comprising:

forming an additional passivation layer of at least one of a non-low dielectric constant material, a low dielectric constant material, and a combination of non-low dielectric constant and low dielectric constant materials over the passivation layer, the bond pad, and in the protective moat; and exposing at least a portion of the bond pad through the additional passivation layer.

11. The method as claimed in claim 7 additionally comprising:

forming a further passivation layer of at least one of a non-low dielectric constant material, a low dielectric constant material, and a combination of non-low dielectric constant and low dielectric constant materials over the intermetal dielectric layer and in the protective moat; and forming the bond pad through the further passivation layer.

12. The method as claimed in claim 7 wherein:

forming the metal wire uses a metal of at least one of copper, aluminum, gold, silver, and a combination thereof;

forming the bond pad uses a metal of at least one of copper, aluminum, gold, silver, and a combination thereof; and additionally comprising:

forming a metal passivation layer in the protective moat of a metal of the same metal as the metal wire.

13. An integrated circuit comprising:

a substrate having a semiconductor device;

a contact dielectric layer over the substrate and the semiconductor device;

an intermetal dielectric layer over the contact dielectric layer;

a metal wire above the contact dielectric layer and in contact therewith;

a passivation layer over the intermetal dielectric layer;

a bond pad connected to the metal wire; and a protective moat through the passivation layer and the intermetal dielectric layer, the protective moat located entirely around the perimeter of the integrated circuit between the metal wire and an outside edge of the integrated circuit.

14. The integrated circuit as claimed in claim 13 additionally comprising:

a guard ring around the metal wire.

15. The integrated circuit as claimed in claim 13 additionally comprising:

an additional passivation layer over the passivation layer, the bond pad, and in the protective moat; and at least a portion of the bond pad is exposed through the additional passivation layer.

16. The integrated circuit as claimed in claim 13 additionally comprising:

a further passivation layer over the passivation layer, the bond pad, and in the protective moat; and at least a portion of the bond pad is exposed through the further passivation layer.

17. The integrated circuit as claimed in claim 13 additionally comprising:

a further passivation layer over the intermetal dielectric layer and in the protective moat; and the bond pad through the further passivation layer.

18. The integrated circuit as claimed in claim 13 additionally comprising:

a metal passivation layer in the protective moat.

19. An integrated circuit comprising:

a substrate having a semiconductor device;

a contact dielectric layer of a non-low dielectric constant dielectric material over the substrate and the semiconductor device;

a plurality of intermetal dielectric layers over the contact dielectric layer, the plurality of intermetal dielectric layers of at least one of low dielectric constant material, ultra-low dielectric constant material, and a combination of low and ultra-low dielectric constant materials;

a plurality of metal wires above the contact dielectric layer, interconnected by vias, and in contact with the semiconductor device;

a passivation layer of at least one of a non-low dielectric constant material, a low dielectric constant material, and a combination of non-low dielectric constant and low dielectric constant materials over the top intermetal dielectric layer;

a bond pad connected to at least one of the plurality of metal wires; and a protective moat entirely around the perimeter of the integrated circuit surrounding a portion of the plurality of intermetal dielectric layers, the plurality of metal wires, and an outside edge of the integrated circuit, forming the protective moat through the passivation layer and the plurality of intermetal dielectric layers and at least one of:

an etch stop layer above the contact dielectric layer, the contact dielectric layer, a liner layer under the contact dielectric layer, and a combination thereof.

20. The integrated circuit as claimed in claim 19 additionally comprising:
a guard ring around the plurality of metal wires including a further plurality of metal wires and vias extending through the plurality of intermetal dielectric layers, the guard ring including trench contacts to the substrate; and
the protective moat around the guard ring through the plurality of intermetal dielectric layers.

21. The integrated circuit as claimed in claim 19 additionally comprising:
a further passivation layer of at least one of a non-low dielectric constant material, a low dielectric constant material, and a combination of non-law dielectric constant and low dielectric constant materials over the passivation layer, the bond pad, and in the protective moat; and
at least a portion of the bond pad is exposed through the further passivation layer.

22. The integrated circuit as claimed in claim 19 additionally comprising:
an additional passivation layer of at least one of a non-low dielectric constant material, a low dielectric constant material, and a combination of non-low dielectric constant and low dielectric constant materials over the passivation layer, the bond pad, and in the protective moat; and
at least a portion of the bond pad is exposed through the additional passivation layer.

23. The integrated circuit as claimed in claim 19 additionally comprising:
a further passivation layer of at least one of a non-low dielectric constant material, a low dielectric constant material, and a combination of non-low dielectric constant and low dielectric constant materials over the intermetal dielectric layer and in the protective moat; and
the bond pad through the further passivation layer.

24. The integrated circuit as claimed in claim 19 wherein:
the metal wire uses a metal of at least one of copper, aluminum, gold, silver, and a combination thereof;
the bond pad uses a metal of at least one of copper, aluminum, gold, silver, and a combination thereof; and
additionally comprising:
a metal passivation layer in the protective moat of a metal of the same metal as the metal wire.

* * * * *